(12) United States Patent
Oki et al.

(10) Patent No.: US 6,830,740 B2
(45) Date of Patent: Dec. 14, 2004

(54) METHOD FOR PRODUCING SOLAR CELL AND SOLAR CELL

(75) Inventors: Konomu Oki, Gunma (JP); Takao Abe, Gunma (JP)

(73) Assignees: Shin-Etsu Handotai Co., Ltd., Tokyo (JP); Shin-Etsu Chemical Co., Ltd., Tokyo (JP)

( * ) Notice: Subject to any disclaimer, the term of this patent is extended or adjusted under 35 U.S.C. 154(b) by 0 days.

(21) Appl. No.: 10/344,398

(22) PCT Filed: Aug. 8, 2001

(86) PCT No.: PCT/JP01/06830

§ 371 (c)(1),
(2), (4) Date: Feb. 11, 2003

(87) PCT Pub. No.: WO02/45284

PCT Pub. Date: Feb. 21, 2002

(65) Prior Publication Data

US 2003/0177976 A1 Sep. 25, 2003

(30) Foreign Application Priority Data

Aug. 15, 2000 (JP) ........................................ 2000-246306

(51) Int. Cl.[7] .............................................. C01B 33/06
(52) U.S. Cl. .................... 423/328.2; 117/13; 117/19; 117/20; 117/937
(58) Field of Search ............................. 117/13, 19, 20, 117/927, 14, 15, 937; 423/328.2

(56) References Cited

FOREIGN PATENT DOCUMENTS

| JP | 06-211598 | 8/1994 |
|---|---|---|
| JP | 06-271384 | 9/1994 |
| JP | 2001-048518 | 2/2001 |
| JP | 2001-064007 | 3/2001 |
| JP | 2001-267610 | 9/2001 |
| WO | WO 00/73542 | 12/2000 |

OTHER PUBLICATIONS

Takao Abe, Advanced Electronic Series I–5, "Silicon", p. 195, Fig. 8.1, Published from Baifukan.

H. Ohtsuka et al., "Effect of Light Degradation on Bifacial Si Solar–Cells" 11th International Photovoltaic Science and Engineering Conference, Sep. 20–24, 1999, Hokkaido, Japan. p. 984.

J. Vanhellemont et al., "Impact of Oxygen Related Extended Defects on Silicon Diode Characteristics", J. Appl. Phys. 77 (11), Jun. 1, 1995. pp. 5669–5676.

Jan Schmidt et al., "Investigation of Carrier Lifetime Instabilities in CZ Growing Silicon", IEEE, 26th PVSC, Sep. 30–Oct. 3, 1997, Anaheim CA., pp. 13–18.

*Primary Examiner*—Felisa Hiteshew
(74) *Attorney, Agent, or Firm*—Hogan & Hartson, LLP

(57) ABSTRACT

The present invention provides a method for producing a solar cell comprising forming the solar cell from a CZ silicon single crystal wafer, wherein a CZ silicon single crystal wafer having an initial interstitial oxygen concentration of 15 ppma or less is used as the CZ silicon single crystal wafer; a solar cell produced from a CZ silicon single crystal wafer, wherein the CZ silicon single crystal wafer has an interstitial oxygen concentration of 15 ppma or less; and a solar cell produced from a CZ silicon single crystal wafer, wherein the CZ silicon single crystal wafer has a BMD density of $5 \times 10^8 / cm^3$ or less. Thus, there can be obtained a solar cell showing little fluctuation of characteristics.

12 Claims, 2 Drawing Sheets

METHOD FOR PRODUCING SOLAR CELL AND SOLAR CELL

TECHNICAL FIELD

The present invention relates to a method for producing a solar cell utilizing a silicon single crystal wafer useful as a material of solar cell and a solar cell.

BACKGROUND ART

When a silicon single crystal is used as a material for producing a solar cell, reduction of the production cost as well as improvement of the conversion efficiency have constituted serious problems.

Hereafter, the technical background of use of a silicon single crystal as a material for solar cells will be explained.

Characteristics of solar cells will be explained first based on type of a substrate material constituting a solar cell. Solar cells are roughly classified based on the type of the substrate material into three types, i.e., "silicon crystal type solar cells", "amorphous silicon type solar cells" and "compound semiconductor type solar cells", and the silicon crystal type solar cells further include "single crystal type solar cells" and "polycrystal type solar cells". Among these, the solar cells showing high conversion efficiency, which is the most important characteristic as a solar cell, are the "compound semiconductor type solar cells", and the conversion efficiency thereof reaches almost 25%. However, as for the compound semiconductor type solar cells, it is extremely difficult to produce compound semiconductors used as the materials thereof, thus they have a problem for becoming popular for general use in respect of the production cost of solar cell substrates, and use thereof has been limited.

The term "conversion efficiency" used herein means a value representing "a ratio of energy, which can be converted into electric energy by a solar cell taken out of the solar cell, to energy of light irradiated on the solar cell" and represented in percentage (%) (it is also called photoelectric conversion efficiency).

Solar cells showing high conversion efficiency in the next place to the compound semiconductor type solar cells are silicon single crystal type solar cells. Since they show power generation efficiency of 20% order, which is close to that of the compound semiconductor solar cells, and substrates for those solar cells may be relatively easily obtained, they constitute the mainstream of the solar cells for wide general use. Furthermore, the silicon polycrystal type solar cells and amorphous silicon type solar cells are also practically used because of low production cost of the solar cell substrate materials therefor, although the conversion efficiencies thereof are inferior to those of the aforementioned two types of solar cells, i.e., about 5 to 15%.

A general method for producing a silicon single crystal type solar cell will be briefly explained hereafter. First, a cylindrical ingot of silicon single crystal is produced by the Czochralski method (referred to as the CZ method or the Czochralski method hereafter) or the floating zone melting method (referred to as the FZ method or the floating zone method hereafter) in order to obtain a silicon wafer serving as a substrate of a solar cell. Further, this ingot is sliced into, for example, a thin wafer having a thickness of about 300 μm, and the wafer is etched for the surface with a chemical solution to remove mechanical damages on the surface to obtain a wafer (substrate) used as a solar cell. This wafer is subjected to a diffusion treatment for impurity (dopant) to form a pn-junction on one side of the wafer, electrodes are attached on the both sides, and an antireflection film for reducing light energy loss by light reflection is finally attached on the sunlight incidence side surface to complete a solar cell.

Although demands for solar cells are recently increasing as one of clean energy sources with a background of environmental problems, the higher energy cost compared with general commercial powers has constituted an obstacle of wide use thereof. In order to reduce the cost of silicon crystal solar cells, it is necessary to further increase the conversion efficiency as well as to reduce the production cost of substrates. For this reason, the cost of substrate material has been reduced by using cone portions, tail portions of single crystal ingots and so forth, which can not be made into products or are not suitable for electronic use for producing so-called semiconductor devices, as raw materials of substrates of single crystal type solar cells. However, such supply of raw materials is unreliable, and the amount thereof is also limited. Therefore, considering expansion of the demands for silicon single crystal type solar cells in future, it will be difficult to stably produce solar cell substrates in a required amount by such a method.

Moreover, in solar cells, it is important to produce a solar cell of larger area in order to obtain a larger electric current. As a method of obtaining a silicon wafer having a large diameter used as a substrate material for producing a solar cell of large area, the CZ method is suitable, which enables easy production of a silicon single crystal having a large diameter and provides superior strength of a produced single crystal. Therefore, the CZ method constitutes the mainstream of the production of silicon crystals for solar cells.

Further, if a silicon wafer serving as a substrate material of a single crystal type solar cell does not have a substrate lifetime (referred to as "lifetime" or abbreviated as LT hereafter), which is one of the characteristics thereof, of 10 μs or more, it cannot be used as a solar cell substrate. Furthermore, in order to obtain a solar cell of high conversion efficiency, it is required that the substrate lifetime should be preferably 200 μs or more.

However, as for a single crystal produced by the CZ method, which is the mainstream of the current methods for producing single crystal ingots, if the solar cell is irradiated with a strong light when the single crystal is processed into a solar cell, lifetime of the solar cell substrate is reduced, and photodegradation is caused. Therefore, sufficient conversion efficiency cannot be obtained, and improvement is desired also for performance of solar cells.

It is known that the cause of the reduction of the lifetime and the photodegradation upon irradiation of strong light on a solar cell produced by using such a CZ method silicon single crystal is an influence of boron and oxygen present in the single crystal substrate. Currently, the conductivity type of wafers used as solar cells is mainly p-type, and boron is usually added to p-type wafers as a dopant. Although a single crystal ingot used as the material of the wafer may be produced by either the CZ method (including the magnetic field applied CZ method, also referred to as the MCZ method hereinafter) or the FZ method, the FZ method suffers from higher production cost for single crystal ingots compared with the CZ method, and in addition, a silicon single crystal having a large diameter is more easily produced by the CZ method as described above. Therefore, at present, single crystals are mainly produced by the CZ method, which enables production of single crystals having a large diameter at a relatively low cost.

However, a crystal produced by the CZ method suffers from a problem that it contains oxygen at a high concentration, and thus the lifetime characteristic is affected by boron and oxygen in a p-type CZ-method silicon single crystal to cause photodegradation.

In order to solve such a problem, the applicants of the present application proposed use of Ga (gallium) instead of B (boron) as a p-type doping agent in a previous application (PCT/00/02850). By using Ga as a dopant as described above, it became possible to prevent reduction of the lifetime due to the influence of B and oxygen.

However, in spite of the elimination of the influences of B and oxygen by use of Ga as the dopant, the lifetime might be reduced and characteristics of solar cells fluctuated among produced solar cells. Such fluctuation of characteristics invited decrease of production yield of solar cells and decrease of the conversion efficiency as the whole solar cell module and thus caused a problem.

DISCLOSURE OF THE INVENTION

The present invention was accomplished in view of such a problem, and its object is, when a solar cell is produced by using a CZ silicon single crystal wafer, to provide a solar cell showing little fluctuation of characteristics by using a CZ silicon single crystal wafer that does not reduce the lifetime.

In order to solve the aforementioned problem, the present invention provides a method for producing a solar cell comprising forming the solar cell from a CZ silicon single crystal wafer, wherein a CZ silicon single crystal wafer having an initial interstitial oxygen concentration of 15 ppma or less is used as the silicon single crystal wafer.

If the initial interstitial oxygen concentration is 15 ppma (JEIDA: Japan Electronic Industry Development Association Standard) or less as described above, oxygen precipitation is hardly generated by a heat treatment for producing a solar cell, a solar cell that avoids reduction of lifetime by BMD can be obtained, and thus a favorable solar cell showing little fluctuation of characteristics can be produced.

In the aforementioned method, the CZ silicon single crystal wafer is preferably a p-type silicon single crystal wafer containing Ga as a dopant.

By using Ga as a dopant of p-type silicon single crystal wafer instead of boron, the photodegradation caused by not only BMD but also presence of boron and oxygen can be prevented.

In the aforementioned method, the concentration of Ga is $3 \times 10^{15}$ to $5 \times 10^{17}$ atoms/cm$^3$.

If the concentration of Ga is $3 \times 10^{15}$ atoms/cm$^3$ or more as described above, reduction of conversion efficiency by consumption of power due to increase of internal resistance of the solar cell can be suppressed, and if the concentration of Ga is $5 \times 10^{17}$ atoms/cm$^3$ or less as described above, the so-called Auger recombination phenomenon, i.e., reduction of the lifetime due to capture of minority carriers by Ga atoms, can be prevented.

Further, the solar cell produced by the method of the present invention is, for example, a solar cell produced from a CZ silicon single crystal wafer, wherein the CZ silicon single crystal wafer has an interstitial oxygen concentration of 15 ppma or less.

If the solar cell is produced from a CZ silicon single crystal wafer having an interstitial oxygen concentration of 15 ppma or less as described above, oxygen precipitation is hardly generated by a heat treatment for producing a solar cell, and the interstitial oxygen concentration is not so high either. Therefore, the reduction of the lifetime resulting from oxygen atoms themselves can be suppressed, and the solar cell shows little fluctuation of characteristics.

The solar cell of the present invention is also a solar cell produced from a CZ silicon single crystal wafer, wherein the CZ silicon single crystal wafer has a BMD density of $5 \times 10^8$/cm$^3$ or less.

If the CZ silicon single crystal wafer has a BMD density of $5 \times 10^8$/cm$^3$ or less as described above, sharp reduction of the lifetime can be prevented, the conversion efficiency of the solar cell can also be maintained at a high level, and thus a solar cell showing little fluctuation in characteristics can be provided.

In this case, the CZ silicon single crystal wafer constituting the aforementioned solar cell is preferably a p-type silicon single crystal wafer containing Ga as a dopant.

This is because, if the dopant of p-type silicon single crystal wafer is not boron, but Ga, as described above, the photodegradation caused by the presence of boron and oxygen can also be prevented.

In this case, the concentration of Ga is preferably $3 \times 10^{15}$ to $5 \times 10^{17}$ atoms/cm$^3$.

If the concentration of Ga is $3 \times 10^{15}$ atoms/cm$^3$ or more as described above, reduction of conversion efficiency by consumption of power due to increase of internal resistance of the solar cell can be suppressed, and if the concentration of Ga is $5 \times 10^{17}$ atoms/cm$^3$ or less as described above, reduction of lifetime caused due to capture of minority carriers by Ga atoms, i.e., the so-called Auger recombination phenomenon, can be prevented.

As described above, according to the method for producing a solar cell and the solar cell of the present invention, a solar cell showing little fluctuation of characteristics can be obtained, and a solar cell of high efficiency can be obtained at a low cost.

BEST MODE FOR CARRYING OUT THE INVENTION

The present invention will be further explained hereafter.

The inventors of the present invention conceived that interstitial oxygen and crystal defects such as oxide precipitates in the wafer bulk (hereafter also referred to as BMD's (Bulk Micro Defects)) contained in a CZ silicon single crystal wafer from which a solar cell was produced might affect conversion efficiency of the solar cell, even if they did not coexist with boron, and assiduously conducted researches. As a result, they accomplished the present invention.

In the case of CZ silicon single crystal, since a single crystal is pulled by using a crucible made of quartz, oxygen (interstitial oxygen) is inevitably incorporated into the pulled crystal. The interstitial oxygen concentration in a crystal immediately after the pulling (as-grown) or a CZ silicon single crystal wafer produced from the crystal is called initial interstitial oxygen concentration, and it is known that, if a CZ silicon single crystal wafer containing such interstitial oxygen is subjected to a heat treatment in a subsequent process, oxide precipitates will precipitate in the bulk.

In this case, photodegradation of conversion efficiency is caused by the presence of oxygen and boron as described above, and this problem is solved by changing the dopant from boron to Ga as described in the previous application. However, use of Ga as a dopant did not always cause to reduce the lifetime, it might actually reduce the lifetime among the produced solar cells, and thus fluctuation in the characteristics of solar cells might be observed.

The inventors of the present invention estimated that the above phenomenon was caused by a high concentration of interstitial oxygen contained in the silicon single crystal wafer. As for Ga, it is known that, if the Ga concentration becomes higher, minority carriers more frequently approach Ga, and if they are captured by Ga, the so-called Auger recombination phenomenon is caused, i.e., the lifetime is reduced. Although such an effect is not known for oxygen atoms, on the other hand, it can be considered that oxygen atoms increase the lattice constant of silicon and influence on the mobility of the minority carriers.

However, it was considered that, since no attention was conventionally paid at all for the initial interstitial oxygen concentration in a silicon single crystal wafer from which a solar cell was formed or BMD in a silicon single crystal wafer constituting a produced solar cell, the characteristics of solar cells fluctuated.

Figure 1:
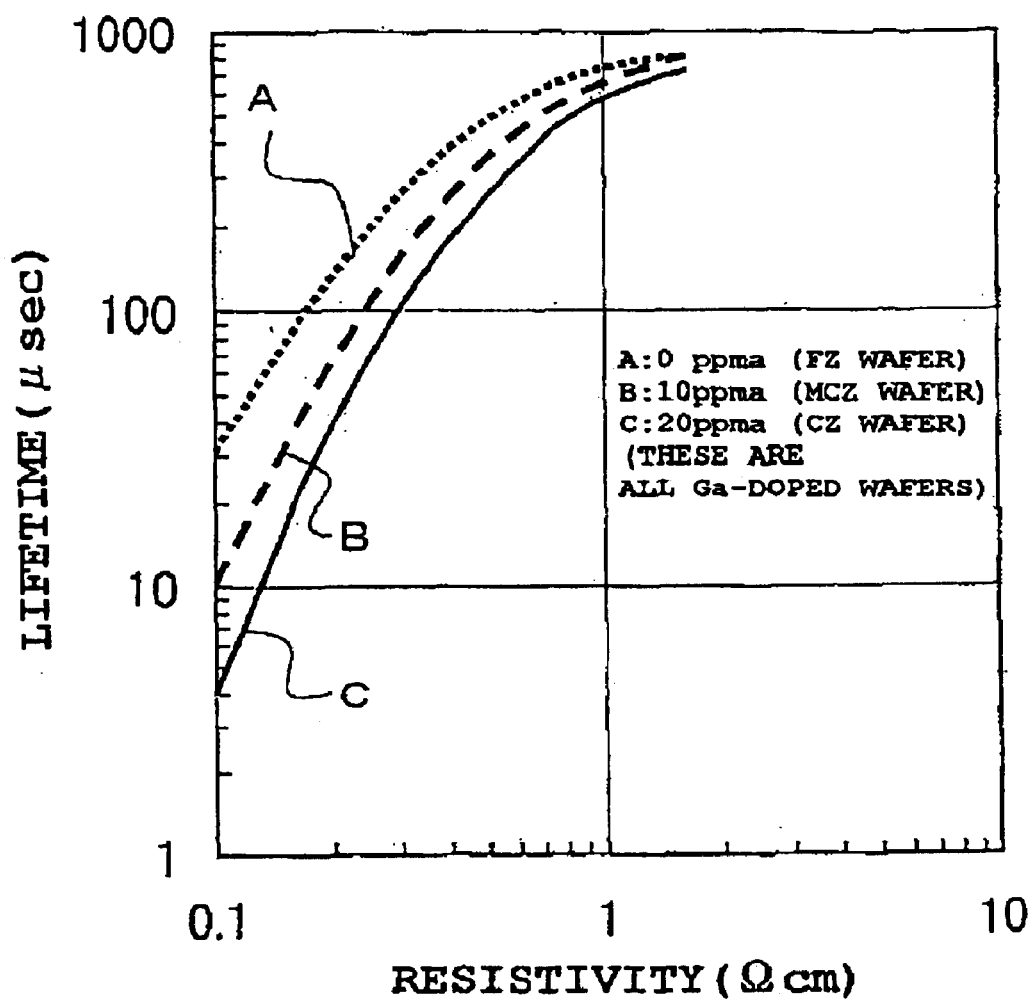
FIG. 1 is a graph showing relationship between resistivity and lifetime for three kinds of Ga-doped silicon single crystal wafers having different oxygen concentrations.

Therefore, the inventors of the present invention measured the lifetime with changing the oxygen concentration in silicon single crystal wafers doped with Ga. FIG. 1 is a graph showing the relationship between resistivity, i.e., the doped amount of Ga, and the lifetime for three kinds of Ga-doped silicon single crystal wafers having different oxygen concentrations. As shown in FIG. 1, it can be seen that, even if Ga is doped at the same amount, a wafer having a higher oxygen concentration shows a shorter lifetime.

Further, BMD's such as fine oxide precipitates may be generated in the bulk of silicon single crystal wafer of solar cell by the process (heat treatment) for producing the solar cell. Since BMD functions as a gettering site that captures heavy metal contamination and so forth, which are harmful in the production processes of semiconductor devices such as LSI, it constitutes one of the advantages of CZ silicon single crystal wafers.

Figure 2:
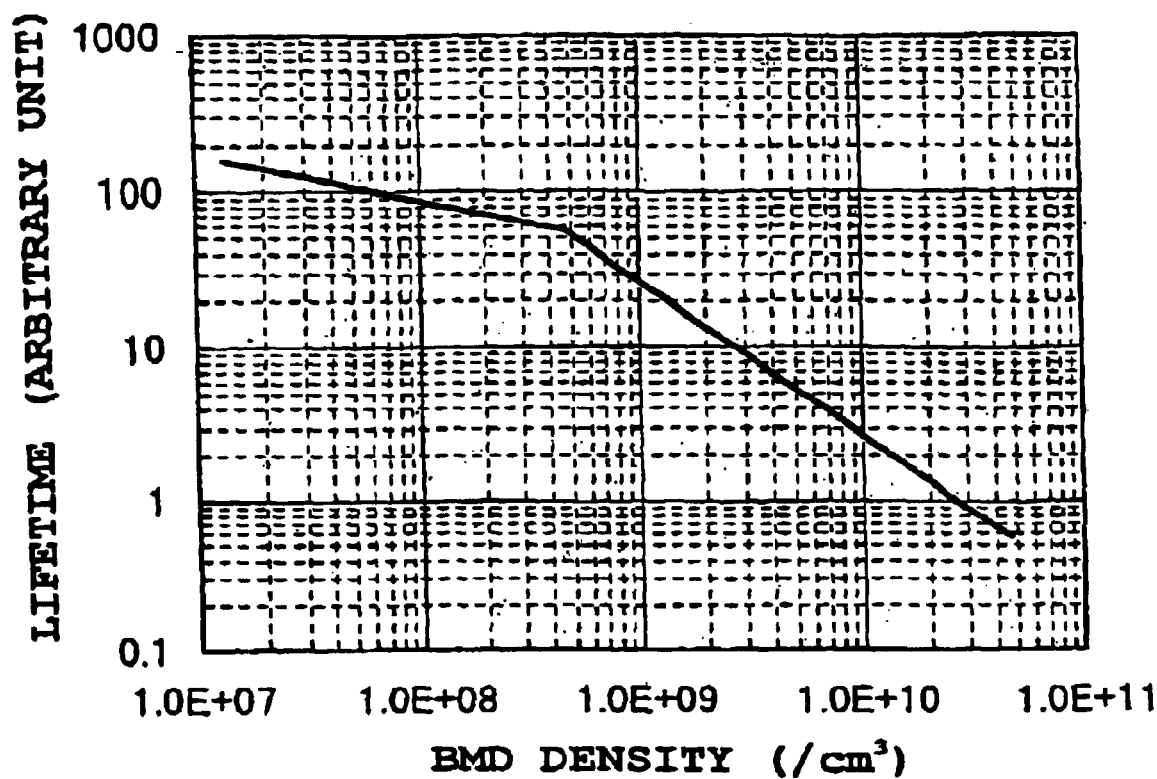
FIG. 2 is a graph showing relationship between BMD density and lifetime in a silicon single crystal wafer.

However, the inventors of the present invention suspected that such a BMD might adversely affect the lifetime of the minority carriers. Therefore, the inventors of the present invention investigated the relationship between the BMD density and the lifetime of the minority carriers in the bulk. FIG. 2 is a graph showing the relationship between the BMD density and the lifetime of minority carriers in a silicon single crystal wafer. As a result of the measurement, it was found that the lifetime was sharply decreased, when the BMD density exceeded $5 \times 10^8/cm^3$, as shown in FIG. 2. Therefore, it is expected that BMD's remaining after the formation of solar cell are preferably reduced as much as possible so that their density should be reduced to a level of $5 \times 10^8/cm^3$ or less, because a CZ silicon single crystal wafer having a longer lifetime is excellent in view of the conversion efficiency as a CZ silicon single crystal wafer used for the production of a solar cell.

These facts revealed that the interstitial oxygen in a silicon single crystal wafer from which a solar cell is produced influences lifetime of a solar cell as interstitial oxygen itself or a fine oxide precipitate irrespective of the presence or absence of boron as a dopant.

Further, as for the relationship between the initial oxygen concentration and the amount of precipitated oxygen varying depending on the heat treatment conditions of a CZ silicon single crystal wafer, it is known that the oxygen precipitation is hardly caused if the initial oxygen concentration is about 15 ppma (JEIDA) or less (refer to Takao Abe, Advanced Electronics Series I-5 "Silicon", p.195, FIG. 8.1, published from Baifukan). Therefore, if a CZ silicon single crystal wafer has an initial oxygen concentration of 15 ppma or less, there are hardly generated oxide precipitates, which are harmful to the conversion efficiency, after the heat treatment, and such a wafer is preferred as a CZ silicon single crystal wafer used for the manufacture of a solar cell.

The present invention was accomplished based on such a principle as described above with investigations of various conditions.

The present invention will be explained in more detail hereafter. However, the present invention is not limited to these explanations.

In order to obtain an initial interstitial oxygen concentration of 15 ppma or less falling within the range according to the present invention, a method conventionally used in the CZ method may be used. An initial interstitial oxygen concentration within the aforementioned range can be easily obtained by means of, for example, reduction of crucible rotational speed, increase of introduced gas flow rate, reduction of atmospheric pressure, control of temperature distribution of silicon melt, control of convection and so forth. Further, when pulling is performed with an oxygen concentration of about 10 ppma or less, the oxygen concentration can be lowered to about 7 ppma by using the so-called MCZ method, in which the pulling is performed with application of a magnetic field.

As for the general production process for a solar cell using a silicon single crystal wafer, the solar cell is produced mainly through a pn-junction formation step, an electrode formation step and an antireflection film formation step. In the pn-junction formation step, a pn-junction is usually formed by introducing n-type impurities into a p-type silicon single crystal wafer surface, and the gas diffusion method, solid phase diffusion method, ion implantation method or the like is used for the introduction of impurities at that time, in which a heat treatment is performed at a temperature from several hundreds degrees ° C. to 1000° C. or higher. Further, the electrode formation step is a step of forming metal serving as an electrode by vacuum evaporation, plating method, printing method or the like, and a heat treatment at about several hundreds degrees ° C. is performed. Furthermore, in the antireflection film formation step, a deposited film is formed by the CVD (chemical vapor deposition) method, PVD (physical vapor deposition) method or the like, and a heat treatment at several hundreds degrees ° C. to about 800° C. is performed also in that case.

Which method is used, i.e., what kinds of heat treatment conditions are used, in each of these steps is a matter depending on production conditions specific to each of the various solar cells. Therefore, in order to determine an initial oxygen concentration of a silicon single crystal wafer used for producing a solar cell having a BMD density of $5 \times 10^8/cm^3$ or less according to the present invention, heat treatment conditions in the production of each solar cell can be preliminarily specified and relationship between the BMD density existing after the heat treatment and the initial oxygen concentration of the silicon single crystal wafer used for producing a solar cell is experimentally obtained to determine such an initial oxygen concentration in the silicon single crystal wafer that the BMD density should become $5 \times 10^8/cm^3$ or less.

In order to form oxide precipitates in a silicon single crystal wafer by a heat treatment, it is necessary that oxygen should exist in a supersaturated state at the heat treatment temperature and fine oxide precipitates, metal impurities or the like serving as nuclei for formation of precipitates (precipitation nuclei) should exist.

Although the precipitation nuclei also exist in an as-grown silicon wafer, they are also formed when supersaturated oxygen become fine oxide precipitates upon a heat treatment at a temperature of about 650° C. to 900° C. In order for such precipitation nuclei to grow and become large oxide precipitates, a heat treatment at a temperature of 900° C. to 1100° C. is required. A heat treatment at a temperature lower than 900° C. requires an extremely long period of time for the growth because of slow diffusion of oxygen, and thus large oxide precipitates are hardly formed. At a temperature exceeding 1100° C., precipitates are not formed since precipitation nuclei are remelted and thus eliminated.

Therefore, although the BMD density can be made very small if all of the heat treatments for forming a solar cell by using a CZ silicon single crystal wafer are performed at a temperature exceeding 1100° C., a low temperature process at 1000° C. or lower is mainly used in an actual process as described above. That is, although oxide precipitates of a large size are not formed when a solar cell is formed by such a process, it has been subjected to a heat treatment at such a temperature that at least fine oxide precipitates serving as precipitation nuclei should be formed, and therefore generation of such precipitation nuclei constitute a factor of the reduction of lifetime.

On the other hand, if a high temperature of about 900° C. to 1100° C. is employed as the heat treatment temperature for forming a solar cell, the size of oxide precipitates becomes large and thus the reduction of lifetime also becomes large. Therefore, the effect of preventing the reduction of lifetime becomes much more significant in a solar cell having a BMD density of $5 \times 10^8/cm^3$ or less according to the present invention, and thus it is more effective.

The BMD density of a formed solar cell can be measured by the OPP (optical precipitate profiler) method, or measured by cleaving the wafer and preferentially etching the cleaved surface. If the size of BMD is small, the oxide precipitates can be grown to a detectable size, for example, by a heat treatment at 1000° C. for 16 hours and then the density can be measured.

The OPP method utilizes a differential interference microscope of Nomarski type, in which a laser light emitted from a light source is first separated into two linearly polarized light beams by a polarizing prism, which are orthogonally intersects with each other and have phases different from each other by 90°, and the beams are entered into a wafer from the wafer mirror surface side. At that time, when one beam passes a defect, phase shift is caused and hence phase difference from another beam is caused. This phase difference is detected by a polarization analyzer after the beams transmit the wafer back surface to detect the defect.

Further, in order to prevent the photodegradation of a solar cell, Ga is preferably doped in an amount of $3 \times 10^{15}$ to $5 \times 10^{17}$ atoms/cm³ (5 to 0.1 Ω·cm in terms of resistivity) as a p-type dopant of a silicon single crystal wafer. When the Ga concentration is lower than $3 \times 10^{15}$ atoms/cm³, resistivity of the wafer becomes higher than required, thus power is consumed due to the internal resistance of the solar cell, and the conversion efficiency may be reduced. Further, if the Ga concentration is higher than $5 \times 10^{17}$ atoms/cm³, resistivity of the wafer is unduly reduced, and thus the lifetime of the minority carriers in the wafer may be reduced by the Auger recombination.

In order to produce a CZ silicon single crystal added with Ga, after Ga is added to silicon melt in a crucible, a seed crystal can be brought into contact with the silicon melt and pulled with rotation. In this case, as for the addition of Ga to the melt in the crucible, a silicon crystal added with Ga at a high concentration can be grown beforehand, and a doping agent produced by crushing the silicon crystal doped with Ga at a high concentration can be added to the silicon melt in a calculated appropriate amount. Thus, an accurate amount of Ga can be doped.

Hereafter, the present invention will be specifically explained with reference to the following examples and comparative example. However, the present invention is not limited to these.

EXAMPLES 1 TO 3, COMPARATIVE EXAMPLE 1

A silicon single crystal having an initial interstitial oxygen concentration of about 14 ppma was pulled by the usual CZ method (doped with Ga, dopant concentration: about $1 \times 10^{16}$ atoms/cm³, Example 1). Further, a silicon single crystal having an initial interstitial oxygen concentration of about 10 ppma (doped with B, dopant concentration: about $1 \times 10^{16}$ atoms/cm³, Example 2) and a silicon single crystal having an initial interstitial oxygen concentration of about 8 ppma (doped with Ga, dopant concentration: about $1 \times 10^{16}$ atoms/cm³, Example 3) were pulled by the MCZ method.

Further, as a comparative example, a silicon single crystal having an initial interstitial oxygen concentration of about 20 ppma (doped with B, dopant concentration: about $1 \times 10^{16}$ atoms/cm³) was pulled by the usual CZ method. Mirror polished wafers having a diameter of 150 mm and crystal orientation of <100> were produced from those single crystals.

Lifetime of these four kinds of wafers was measured by using the microwave-PCD method (photo conductive decay method). Then, without actually forming solar cells, the wafers were subjected to a heat treatment consisting of three stages of 800° C. for 30 minutes (pn-junction formation step)+600° C. for 30 minutes (electrode formation step)+700° C. for 60 minute (antireflection film formation step) as a heat treatment simulating the production process of a solar cell, and thereafter the lifetime was measured again. Further, the wafers were subjected to a heat treatment at 1000° C. for 16 hours so that BMD's should grow to have a detectable size, and the BMD density was measured by the OPP method.

As a result, the wafers of Examples 1 to 3 all showed favorable values of lifetime, i.e., 500 microseconds or more before and after the heat treatment, and reduction of the lifetime due to the heat treatment was not observed. Further, the BMD density was $1 \times 10^8/cm^3$ or less for all of the wafers.

On the other hand, as for the wafer of Comparative Example 1, about 20% reduction of the lifetime due to the heat treatment was observed, and the BMD density was about $1 \times 10^9/cm^3$.

The present invention is not limited to the embodiments described above. The above-described embodiments are mere examples, and those having the substantially same structure as that described in the appended claims and providing the similar functions and advantages are included in the scope of the present invention.

What is claimed is:

1. A solar cell produced from a CZ silicon single crystal wafer, wherein the CZ silicon single crystal wafer has an interstitial oxygen concentration of 15 ppma or less.

2. The solar cell according to claim 1, wherein the CZ silicon single crystal wafer constituting the solar cell is a p-type silicon single crystal wafer containing Ga as a dopant.

3. The solar cell according to claim 2, wherein the concentration of Ga is $3\times10^{15}$ to $5\times10^{17}$ atoms/cm$^3$.

4. A solar cell produced from a CZ silicon single crystal wafer, wherein a CZ silicon single crystal wafer has a BMD density of $5\times10^{8}$/cm$^3$ or less.

5. The solar cell according to claim 4, wherein the CZ silicon single crystal wafer constituting the solar cell is a p-type silicon single crystal wafer containing Ga as a dopant.

6. The solar cell according to claim 5, wherein the concentration of Ga is $3\times10^{15}$ to $5\times10^{17}$ atoms/cm$^3$.

7. A method for producing a solar cell comprising forming the solar cell from a CZ silicon single crystal wafer, wherein a CZ silicon single crystal wafer having an initial interstitial oxygen concentration of 15 ppma or less is used as the CZ silicon single crystal wafer.

8. The method for producing a solar cell according to claim 7, wherein the CZ silicon single crystal wafer is a p-type silicon single crystal wafer containing Ga as a dopant.

9. The method for producing a solar cell according to claim 8, wherein the concentration of Ga is $3\times10^{15}$ to $5\times10^{17}$ atoms/cm$^3$.

10. A solar cell produced by the method according to claim 9.

11. A solar cell produced by the method according to claim 8.

12. A solar cell produced by the method according to claim 7.

* * * * *